(12) United States Patent
Dagan

(10) Patent No.: US 11,538,524 B2
(45) Date of Patent: Dec. 27, 2022

(54) SILICON OVER INSULATOR TWO-TRANSISTOR TWO-RESISTOR IN-SERIES RESISTIVE MEMORY CELL

(71) Applicant: Weebit Nano Ltd., Hod Hasharon (IL)

(72) Inventor: Lior Dagan, Tzafon (IL)

(73) Assignee: Weebit Nano Ltd., Hod Hasharon (IL)

( * ) Notice: Subject to any disclaimer, the term of this patent is extended or adjusted under 35 U.S.C. 154(b) by 0 days.

(21) Appl. No.: 17/373,118

(22) Filed: Jul. 12, 2021

(65) Prior Publication Data
US 2022/0020431 A1 Jan. 20, 2022

Related U.S. Application Data

(60) Provisional application No. 63/052,147, filed on Jul. 15, 2020.

(51) Int. Cl.
*G11C 11/00* (2006.01)
*G11C 13/00* (2006.01)

(52) U.S. Cl.
CPC ........ *G11C 13/0069* (2013.01); *G11C 13/004* (2013.01); *G11C 13/0026* (2013.01); *G11C 13/0028* (2013.01); *G11C 2213/33* (2013.01); *G11C 2213/79* (2013.01)

(58) Field of Classification Search
CPC ............ G11C 13/0069; G11C 13/0026; G11C 13/0028; G11C 13/004
USPC ........................................................ 365/148
See application file for complete search history.

(56) References Cited

U.S. PATENT DOCUMENTS

| | | |
|---|---|---|
| 5,637,513 A | 6/1997 | Sugiyama |
| 5,665,629 A | 9/1997 | Chen et al. |
| 6,587,370 B2 | 7/2003 | Hirai |
| 7,935,619 B2 | 5/2011 | Jung et al. |
| 8,113,437 B2 | 2/2012 | Kang |
| 8,174,874 B2 | 5/2012 | Inaba |
| 8,233,308 B2 | 7/2012 | Schricker et al. |
| 8,981,328 B2 | 3/2015 | Greene et al. |
| 9,147,836 B2 | 9/2015 | Greene et al. |
| 9,165,610 B1 | 10/2015 | Poh et al. |
| 9,478,273 B2 | 10/2016 | Dray et al. |
| 9,691,479 B1 | 6/2017 | Grafals et al. |
| 9,865,322 B2 | 1/2018 | Dray et al. |
| 9,889,086 B2 | 2/2018 | Bian et al. |
| 9,934,853 B2 | 4/2018 | Yang et al. |
| 9,953,994 B2 | 4/2018 | Or-Bach et al. |
| 10,102,908 B2 | 10/2018 | Catthoor et al. |
| 10,163,503 B2 | 12/2018 | Lee et al. |

(Continued)

*Primary Examiner* — Vu A Le
(74) *Attorney, Agent, or Firm* — M&B IP Analysts, LLC

(57) ABSTRACT

A resistive random-access memory (ReRAM) cell formed on a silicon over insulator substrate (SOI) is provided. The ReRAM includes a SOI substrate, a first MOSFET and a second MOSFET, each of which having a drain port, a gate port, a source port, and a bulk port. The drain port of the second MOSFET is connected to the source port of the first MOSFET; a first resistive element and a second resistive element, each having a first port and a second port, wherein the first ports of both resistive elements are connected to the drain of the first MOSFET; a first word line and a second word line connected to the gate port of the first MOSFET and the second MOSFET, respectively; and the state of the ReRAM cell is determined upon applying a predefined potential.

14 Claims, 3 Drawing Sheets

(56) References Cited

U.S. PATENT DOCUMENTS

| | | |
|---|---|---|
| 10,163,505 B2 | 12/2018 | Lee et al. |
| 10,163,981 B2 | 12/2018 | Chen et al. |
| 10,439,829 B1 | 10/2019 | Lin et al. |
| 10,566,387 B2 | 2/2020 | Chen et al. |
| 10,636,842 B1 | 4/2020 | Cheng et al. |
| 10,783,957 B1 | 9/2020 | Jaiswal et al. |
| 10,796,759 B2 | 10/2020 | Yang et al. |
| 10,903,274 B2 | 1/2021 | Chen et al. |
| 10,934,163 B2 | 3/2021 | Leipold et al. |
| 2006/0067112 A1* | 3/2006 | Ferrant .................... G11C 8/14 365/158 |
| 2017/0256587 A1* | 9/2017 | Tsuji .................. H03K 19/1735 |
| 2020/0152866 A1 | 5/2020 | Reznicek et al. |
| 2020/0161309 A1 | 5/2020 | Asami |
| 2020/0161373 A1* | 5/2020 | Cheng ................. H01L 27/2436 |
| 2021/0074765 A1 | 3/2021 | Reznicek et al. |
| 2021/0125666 A1* | 4/2021 | Nguyen ............. G11C 13/0026 |

\* cited by examiner

SILICON OVER INSULATOR TWO-TRANSISTOR TWO-RESISTOR IN-SERIES RESISTIVE MEMORY CELL

CROSS-REFERENCE TO RELATED APPLICATIONS

This application claims the benefit of U.S. Provisional Application No. 63/052,147 filed on Jul. 15, 2020, the contents of which are hereby incorporated by reference.

TECHNICAL FIELD

The disclosure generally relates to resistive random-access memory (ReRAM) cells, and more particularly to write to and read from in-series two-transistor two-resistor (2T2R) class of ReRAM cells, and furthermore particularly to a ReRAM cell using a silicon-over-insulator implementation.

BACKGROUND

In the related art, there are many types of known non-volatile random-access memory (RAM) cells. These kinds of memory cells allow the random access to each memory cell, or group of cells if so configured, and ensure that the data is retained in the memory cell even when power is lost. A certain class of these memory cells is known by the name resistive RAM (ReRAM) cells. In these cells, data are stored by changing the resistance of a dielectric solid-state material. The process of operation of the ReRAM cell includes the forming of the cell which involves creating a filament which thereafter may be reset, or broken, for the purpose of creating a high resistance, or set, in fact reformed so that low resistance is achieved.

In the related art, a variety of ReRAM cells may be found, typically of having a resistors-only crosspoint configuration, a configuration including a single transistor and a single resistor (1T1R), a configuration including a single transistor and two resistors (1T2R), and a configuration including two transistors and two resistors (2T2R). The first and most basic is the crosspoint configuration, where there are no transistors. Only a resistor is used to connect a word and a bit line. The leak paths which are formed in this configuration affect the accuracy of read operations of the 1R ReRAM cell in the crosspoint configuration array and is a major problem particularly at high temperatures. In the 1T1R configuration a transistor is added to overcome the leak path problem, since all unselected word lines are isolated from the corresponding bit line and the leak paths are presented with a very high resistance path. This configuration, however, is costly in terms of area since most of the cell area is now occupied by a transistor. To overcome the significant area penalty of 1T1R, the 1TnR configuration is employed, where 'n' is an integer greater than '1'. The leakage is still lower than in the crosspoint configuration, but is not completely eliminated as in the 1T1R case. This is because of existing leak paths through the other (n−1) resistors which are connected to the same transistor. A compromise between the crosspoint and the 1T1R, the 1TnR achieves leak paths lower than crosspoint, at an area penalty that is not as high as in the 1T1R case.

In both 1T1R and 1T2R the endurance is limited and the read window is known to be problematic. This is resolved with the 2T2R configuration, at an area penalty that is even higher than 1T2R, however, the differential reading gives a better operating window and reliability. In an array configuration using 1T1R ReRAM cells, each resistor is connected on one side to a bit line (BL), and on the other side to an inverted BL (BLb) controlled by a select transistor that is switched by a word line (WL). In practice, this configuration suffers from a small window separating "1" from "0" stored in the ReRAM cell. Therefore, aggressive programming (or writing) is required which in turn limits the endurance of the 1T1R ReRAM cell.

The problem for large ReRAM integration is the selector size and there are attempts to focus on exotic solutions for the reduction of the selector size. This is a result of the need to program in high voltage. For example, a 4.8V MOSFET needs a minimal length ("L") of 500 nm which leads to impractically large array sizes.

It would therefore be desirable for a solution which uses a smaller selector while using non-exotic, well-studied circuit elements and manufacturing technologies while overcoming the challenges noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "some embodiments" or "certain embodiments" may be used herein to refer to a single embodiment or multiple embodiments of the disclosure.

Certain embodiments disclosed herein include a resistive random-access memory (ReRAM) cell comprising: a silicon over insulator (SOI) substrate; a first metal-oxide semiconductor field-effect transistor (MOSFET) formed on the SOI substrate having a drain port, a gate port, a source port, and a bulk port; a second MOSFET formed on the SOI substrate having a drain port, a gate port, a source port, and a bulk port, wherein the drain port of the second MOSFET is connected to the source port of the first MOSFET; a first resistive element formed on the SOI substrate having a first port and a second port, wherein the first port of the first resistive element is connected to the drain of the first MOSFET; a second resistive element formed on the SOI substrate having a first port and a second port, wherein the first port of the second resistive element is connected to the drain of the first MOSFET; a first word line connected to the gate port of the first MOSFET; a second word line connected to the gate port of the second MOSFET; a bit line connected to the second port of the first resistive element; an inverted bit line of the bit line connected to the second port of the second resistive element; and a select line connected to the source of the second MOSFET; wherein upon applying a predefined potential at the bit line, the inverted bit line, the word line, the second word line, the select line, the bulk port of the first MOSFET, and the bulk port of the second MOSFET, a state of the ReRAM cell is determined.

Certain embodiments disclosed herein also include a resistive random-access memory (ReRAM) cell comprising: a silicon over insulator (SOI) substrate; a first metal-oxide semiconductor field-effect transistor (MOSFET) formed on the SOI substrate having a drain port, a gate port, a source port, and a bulk port; a second MOSFET formed on the SOI substrate having a drain port, a gate port, a source port, and a bulk port, wherein the drain port of the second MOSFET is connected to the source port of the first MOSFET; a first resistive element formed on the SOI substrate having a first port and a second port, wherein the first port of the first resistive element is connected to the source of the second MOSFET; a second resistive element formed on the SOI substrate having a first port and a second port, wherein the first port of the second resistive element is connected to the source of the second MOSFET; a first word line connected to the gate port of the first MOSFET; a second word line connected to the gate port of the second MOSFET; a bit line connected to the drain port of the first MOSFET; a select line connected to the second port of the first resistive element; and an inverted select line connected to the second port of the second resistive element; wherein upon applying a predefined potential at the bit line, the word line, the inverted word line, the select line, the inverted select line, the bulk port of the first MOSFET, and the bulk port of the second MOSFET, a state of the ReRAM cell is determined.

BRIEF DESCRIPTION OF THE DRAWINGS

The subject matter disclosed herein is particularly pointed out and distinctly claimed in the claims at the conclusion of the specification. The foregoing and other objects, features and advantages of the disclosure will be apparent from the following detailed description taken in conjunction with the accompanying drawings.

DETAILED DESCRIPTION

Figure 1:
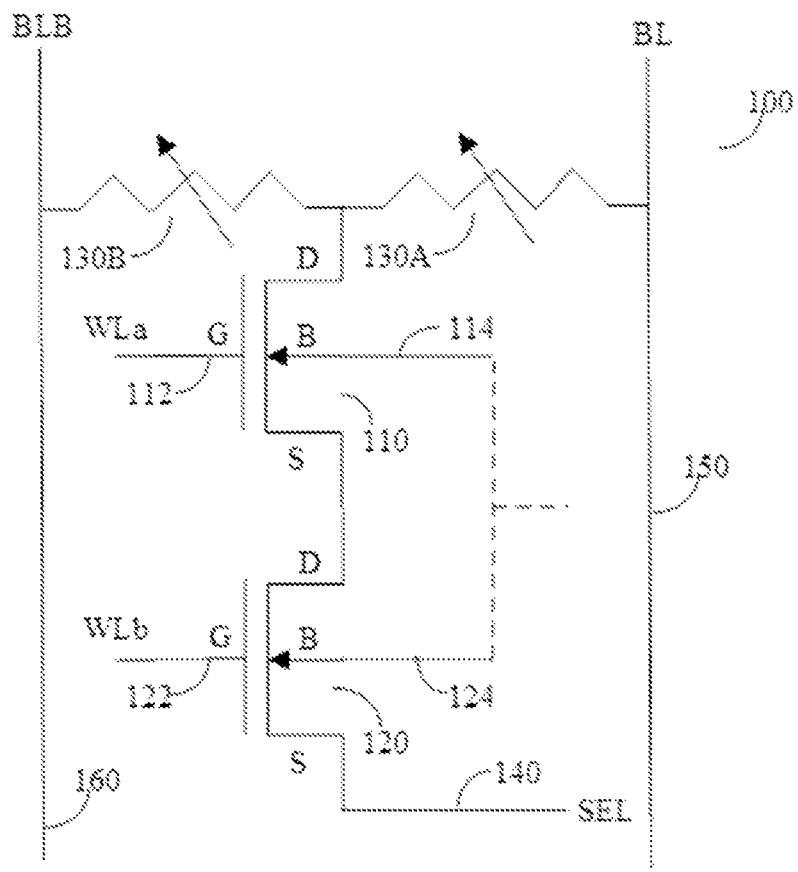
FIG. 1 is a schematic diagram of a two-transistor and two-resistor (2T2R) silicon over insulator (SOI) resistive random-access memory (ReRAM) cell according to one embodiment.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

A resistive random-access memory (ReRAM) cell configured with two transistors and two resistors (2T2R) is formed using silicon over insulator (SOI) technology. The cell includes a first MOSFET and a second MOSFET connected in series, formed over the SOI substrate. In an example embodiment, a first resistor having a top end port (TEP) and a bottom end port (BEP) is connected to the drain of the first MOSFET at its BEP, and a second resistor, having a TEP and a BEP, is also connected to the drain of the first MOSFET at its BEP. The TEP of the first resistor is connected to a bit line (BL) and the TEP of the second resistor to an inverted bit line (BLB). A first word line (WLa) is connected to the gate of the first MOSFET and a second word line (WLb) is connected to the gate of the second MOSFET. A select line (SEL) is connected to the source of the second MOSFET.

The cell is designed and implemented using a SOI technology where transistors are formed over an insulation layer. As SOI technology is well-known in the art, its characteristics are not discussed herein. However, those of ordinary skill in the art would appreciate the advantages of SOI technology with respect of the disclosed ReRAM cell. While N-type MOSFETs are shown, the cell may be implemented using P-type MOSFETs with the necessary adaptation. The advantage of these arrangements is the ability to use small transistors since no high voltage is applied across the MOSFETs as is suggested by the prior art solutions. A 1.2V transistor may have a length ("L") of 90 nm while a 1V transistor may have L of 22 nm. This results in a significantly small, and ever more practical ReRAM arrays. It should be noted that while the term "programming" is used herein, the term "writing" may and is frequently used to describe the same operation, i.e., updating the content of a memory cell.

FIG. 1 is an example schematic diagram of a 2T2R SOI ReRAM cell 100 according to one embodiment. A first metal-oxide semiconductor field-effect transistor (MOSFET) 110 is connected in series to a second MOSFET 120 such that the source of the first MOSFET 110 is connected to the drain of the second MOSFET 120. A single bulk connection as it is assumed, i.e., bulk 114 is connected to bulk 124, and even more specifically, the bulks of the two MOSFETS 110 and 120 are the same bulk or if separate bulks, at the same bulk potential as explained herein. The gate of the first MOSFET 110 is connected to a first word line (WLa) 112. The gate of the second MOSFET 120 is connected to a second word line (WLb) 122. The source of the second MOSFET 120 is connected to a select line (SEL) 140. To the drain of the first MOSFET 110 there are two resistors 130A and 130B connected, each at the BEP of each respective resistor. The TEP of the first resistor 130A is connected to a bit line (BL) 150. The TEP of the second resistor 130B is connected to an inverted bit line (BLB) 160. In an embodiment, the cell may be reset or programmed as desired by applying predefined potentials. The predefined potentials may be determined by simulation, however in general, at these particularly nanometric featured sizes, the potentials may be described as 0V, low (e.g., 1.2V), and high (e.g., 2.4V) voltages. Examples for the predefined potentials are provided in Tables 1-4. Furthermore, incorporation of SOI allow small cell implementation, which is otherwise not achievable in other manufacturing technologies that require larger MOSFETs for proper operation.

Figure 2:
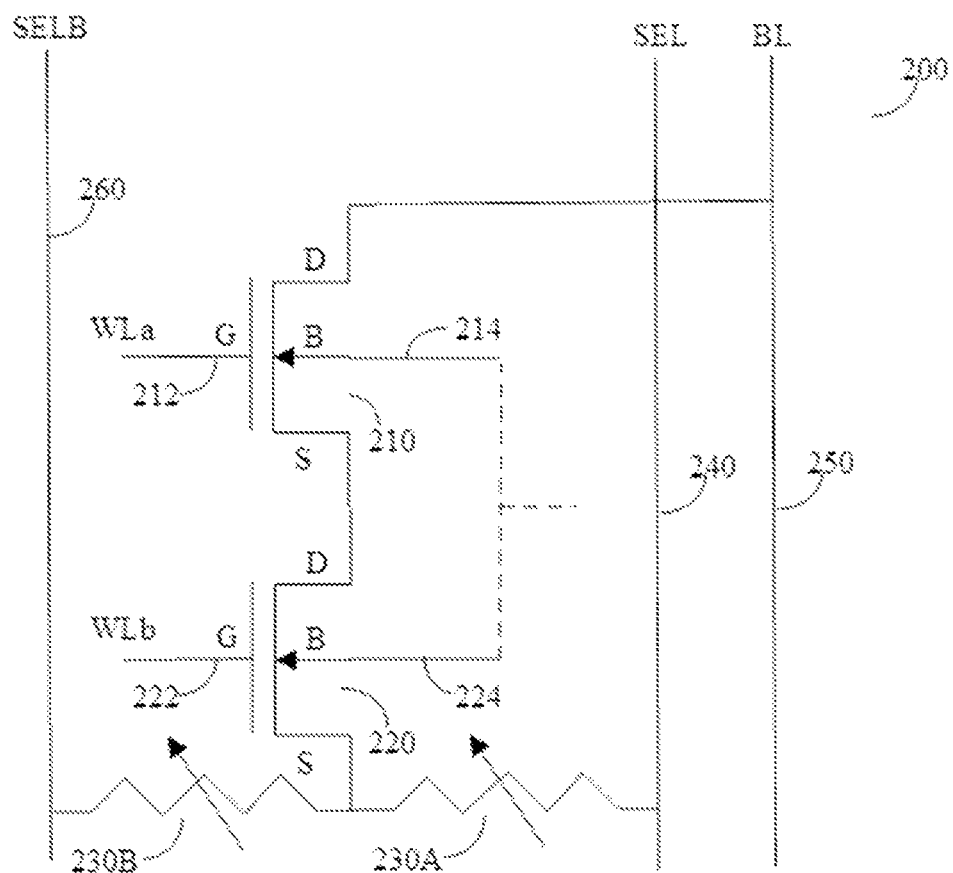
FIG. 2 is a schematic diagram of a 2T2R SOI ReRAM cell according to another embodiment.

FIG. 2 is an example schematic diagram of a 2T2R SOI ReRAM cell 200 according to another embodiment. A first MOSFET 210 is connected in series to a second MOSFET 220 such that the source of the first MOSFET 210 is connected to the drain of the second MOSFET 220. A single bulk connection is typically used, i.e., bulk 214 is connected to bulk 224, and even more specifically, the bulks of the two MOSFETS 210 and 220 are the same bulk or at the same bulk potential as explained herein. There are two resistors 230A and 230B connected to the source of the second MOSFET 220, each at the TEP of each respective resistor. The BEP of the first resistor 230A is connected to a select line (SEL) 240. The BEP of the second resistor 230B is connected to an inverted select line (SELB) 260. The drain of the first MOSFET 210 is connected to a bit line (BL) 250. In an embodiment, the cell may be reset or programmed as desired by applying predefined potentials. The predefined potentials may be determined by simulation, however in general, at these particularly nanometric featured sizes, the potentials may be described as 0V, low (e.g., 1.2V), and high (e.g., 2.4V) voltages. Furthermore, incorporation of SOI allow small cell implementation, which is otherwise not achievable in other manufacturing technologies that require larger MOSFETs for proper operation.

Figure 3:
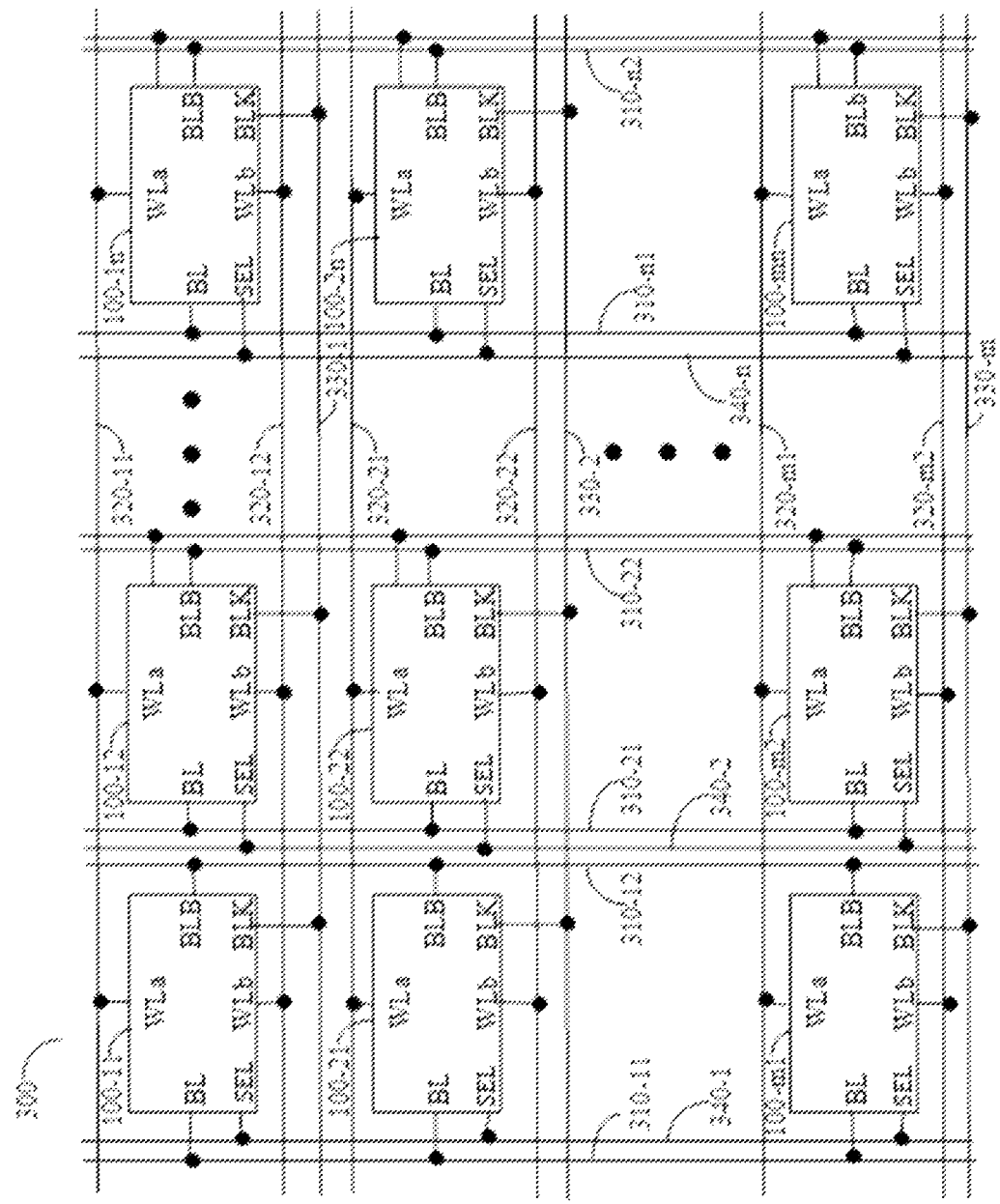
FIG. 3 is a schematic diagram of a ReRAM array including of a plurality of 2T2R SOI ReRAM cells according to an embodiment.

FIG. 3 is an example schematic diagram of a ReRAM array 300 including of a plurality of 2T2R SOI ReRAM cells according to an embodiment. This particular example is for cells of the types shown in the embodiment of FIG. 1. It should be noted that the above disclosed principles of the 2T2R SOI ReRAM cells may be applied to create a non-SOI ReRAM array with the necessary adaptation without undue burden. Each cell is referred to with respect to FIG. 3 as a ReRAM cell 100. In the embodiment shown in FIG. 3, each of the ReRAM cells 100 has a BL, BLB, WLa, WLb, SEL ports as well as a single bulk connection (BLK) as it is assumed that the bulks of the two MOSFETS are the same bulk or at the same bulk potential as explained herein. The ReRAM array 300 includes a plurality of ReRAM cells 100 that are organized in columns and rows. The ReRAM array 300 includes 'n' columns, where 'n' is an integer equal to or greater than '1', and cm' rows, where cm' is an integer equal to or greater than '1'. A row of ReRAM memory cells 100 includes, for example, cells 100-11 through 100-1n. A column of ReRAM memory cells 100 includes, for example, cells 100-11 through 100-m1. ReRAM cell 100-11 is connected to BL 310-11, BLB 310-12, and further to WLa 320-11, and WLb 320-12. Similarly, ReRAM cell 100-mn is connected to BL 310-n1, BLB 310-n2, and further to WLa 320-m1 and WLb 320-m2. For the purpose of programming each ReRAM cell 100, predefined potentials are provided to the bit lines and the word lines for the operation of the array as further described herein. The predefined potentials may be determined by simulation, however in general, at these particularly nanometric featured sizes, the potentials may be described as 0V, low (e.g., 1.2V), and high (e.g., 2.4V) voltages.

The operation of the ReRAM cell shown in FIG. 1 can be simulated by applying example predefined potentials shown in Tables 1 and 2 for operation on resistor connected to BL1. When a potential range is on 340-2 and 310-11 and if all transistors are conducting, the voltage values must be identical. In an embodiment, BL0B may be either driven to High-Z or to the value of BL0. In another embodiment, BL0B may be driven to the value for BL0, and BL0 may be in high-Z. Furthermore, the post-pulse can be removed completely, as long as the abs($V_{GS}$), abs($V_{GD}$), and abs ($V_{DS}$) on all array cells are no more than the safe operating area (SOA) limits, which are the voltage levels that will not damage any of the select transistors. When a voltage range, e.g., 0 to 1.2 volts, is used for each of 310-12 and 310-11 while at least one of the transistors is conducting, the voltage values must be identical. Also, the post-pulse can be removed completely, as long as the abs($V_{GS}$), abs($V_{GD}$), and abs($V_{DS}$) on all array cells are no more than the SOA limit.

TABLE 1 values in volts

| Mode | BL0 310-11 | SEL0 340-2 | BL1 310-21 | SEL1 340-1 | WLa 320-11 | WLb 320-12 | WLa 320-21 | WLb 320-22 | BLB1 310-22 and BLB0 310-12 |
|---|---|---|---|---|---|---|---|---|---|
| Before | 0 | 0 | 0 | 0 | 0 | 0 | 0 | 0 | Z |
| Pre-write | 1.2-0 | 1.2-0 | 1.2 | 0 | 1.2 | 0 | 1.2 | 0 | Z |
| Program | 1.2 | 1.2 | 2.4 | 0 | 1.2 | 0 | 1.2 | 1.2 | Z |

TABLE 1-continued values in volts

| Mode | BL0 310-11 | SEL0 340-2 | BL1 310-21 | SEL1 340-1 | WLa 320-11 | WLb 320-12 | WLa 320-21 | WLb 320-22 | BLB1 310-22 and BLB0 310-12 |
|---|---|---|---|---|---|---|---|---|---|
| Post-write | 1.2-0 | 1.2-0 | 1.2 | 0 | 1.2 | 0 | 1.2 | 0 | Z |
| After | 0 | 0 | 0 | 0 | 0 | 0 | 0 | 0 | Z |

TABLE 2 values in volts

| Mode | BL0 310-11 | SEL0 340-2 | BL1 310-21 | SEL1 340-1 | WLa 320-11 | WLb 320-12 | WLa 320-21 | WLb 320-22 | BLB1 310-22 and BLB0 310-12 |
|---|---|---|---|---|---|---|---|---|---|
| Before | 0 | 0 | 0 | 0 | 0 | 0 | 0 | 0 | Z |
| Pre-erase | 1.2-0 | 1.2-0 | 0 | 1.2 | 0 | 1.2 | 0 | 1.2 | Z |
| Erase | 1.2 | 1.2 | 0 | 2.4 | 0 | 1.2 | 2.4 | 2.4 | Z |
| Post-erase | 1.2-0 | 1.2-0 | 0 | 1.2-0 | 1.2-0 | 0 | 0 | 1.2-0 | Z |
| After | 0 | 0 | 0 | 0 | 0 | 0 | 0 | 0 | Z |

Tables 3 and 4 show the operation of a resistor connected to BLB. When the potential range is on 310-12 and 310-11 and if all transistors are conducting, their voltage values must be identical. In an embodiment, BL0 may also be driven to High Z instead of a value of BL0B. In another embodiment, BL0B may be driven to Z, and BL0 may be driven to the value allocated to BL0B in the tables below. Other comments discussed herein regarding voltage range similarly apply.

TABLE 3 values in volts

| Mode | BL0B 310-11 | SEL0 340-2 | BL1B 310-21 | SEL1 340-1 | WLa 320-11 | WLb 320-12 | WLa 320-21 | WLb 320-22 | BL1 310-21 and BL0 310-11 |
|---|---|---|---|---|---|---|---|---|---|
| Before | 0 | 0 | 0 | 0 | 0 | 0 | 0 | 0 | Z |
| Pre-write | 1.2-0 | 1.2-0 | 1.2 | 0 | 1.2 | 0 | 1.2 | 0 | Z |
| Program | 1.2 | 1.2 | 2.4 | 0 | 1.2 | 0 | 1.2 | 1.2 | Z |
| Post-write | 1.2-0 | 1.2-0 | 1.2 | 0 | 1.2-0 | 0 | 1.2 | 0 | Z |
| After | 0 | 0 | 0 | 0 | 0 | 0 | 0 | 0 | Z |

TABLE 4 values in volts

| Mode | BL0B 310-11 | SEL0 340-2 | BL1B 310-21 | SEL1 340-1 | WLa 320-11 | WLb 320-12 | WL 320-21 | WLb 320-22 | BL1 310-21 and BL0 310-11 |
|---|---|---|---|---|---|---|---|---|---|
| Before | 0 | 0 | 0 | 0 | 0 | 0 | 0 | 0 | Z |
| Pre-erase | 1.2-0 | 1.2-0 | 0 | 1.2 | 0 | 1.2 | 0 | 1.2 | Z |
| Erase | 1.2 | 1.2 | 0 | 2.4 | 0 | 1.2 | 2.4 | 2.4 | Z |

TABLE 4-continued values in volts

| Mode | BL0B 310-11 | SEL0 340-2 | BL1B 310-21 | SEL1 340-1 | WLa 320-11 | WLb 320-12 | WL 320-21 | WLb 320-22 | BL1 310-21 and BL0 310-11 |
|---|---|---|---|---|---|---|---|---|---|
| Post-erase | 1.2-0 | 1.2-0 | 0 | 1.2-0 | 0 | 0-1.2 | 0 | 1.2-0 | Z |
| After | 0 | 0 | 0 | 0 | 0 | 0 | 0 | 0 | Z |

It should be noted that voltage schemes provided in Tables 1~4 are merely examples and other schemes may be used for the configuration shown in FIG. 1. It should be appreciated that additional necessary voltages to achieve programming and/or erase of the configuration shown in FIG. 2 can be achieved without undue burden. In an embodiment, any of the MOSFETs may be replaced by a plurality of MOSFETs connected in series. For example, if the MOSFET 130 is replaced by two MOSFETs each with a drain port and a source port, then the first MOSFET source port is connected to the drain port of the second MOSFET, the drain port of the first MOSFET replaces the drain port of the MOSFET 130, and the source port of the second MOSFET replaces the source port of the MOSFET 130. The bulks of each of the first and the second MOSFETs that include the aggregated MOSFET 130 are, in an embodiment, a single bulk as further discussed herein. The gates of each of the first and second MOSFETs that include the aggregated MOSFET 130 are each connected to a separate word line (WLi) and receive signals to properly operate in this configuration. It is particularly noted that such configuration allow handling of larger $V_{DS}$ and $V_{GS}$ voltages in comparison to small feature transistors that handle lower voltage levels.

According to the disclosed embodiments, the ReRAM cell 100 (FIG. 1) is created by forming a first MOSFET 110 over an SOI substrate (not shown) and a second MOSFET 120 over the SOI substrate (not shown), such that the source of the first MOSFET 110 and the drain of the second MOSFET 120 are electrically connected. In an embodiment, the bulks of each of the MOSFETs 110 and 120 are electrically connected or otherwise the same bulk. A first resistive element having a BEP and a TEP is formed directly or indirectly over the SOI. A second resistive element having a BEP and a TEP is formed directly or indirectly over the SOI. The BEP of the first and the second resistive elements are formed such that they electrically connect to the drain of the first MOSFET 110.

A first word line (WLa) is formed to electrically connect with the gate of the first MOSFET 110. A second word line (WLb) is formed to electrically connect with the gate of the second MOSFET 120. A select line (SEL) 140 is formed to electrically connect with the source of the second MOSFET 120. A bit line (BL) 150 is formed to electrically connect to the second port of the first resistive element 130A. An inverted bit line (BLB) 160 is formed to electrically connect to the second port of the second resistive element 130B.

In an embodiment, the MOSFETs 110 and 120 are formed in the same bulk, that is, the bulks 114 and 124 are the same bulk, otherwise, in another embodiment they may be electrically connected. It should be understood that the ReRAM cell 200 may be similarly formed without undue burden, following the same principles of the embodiments and adapting as may be necessary and without further burden.

It should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise, a set of elements comprises one or more elements.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

All examples and conditional language recited herein are intended for pedagogical purposes to aid the reader in understanding the principles of the disclosure and the concepts contributed by the inventor to furthering the art, and are to be construed as being without limitation to such specifically recited examples and conditions.

What is claimed is:

1. A resistive random-access memory (ReRAM) cell comprising:
    a silicon over insulator (SOI) substrate;
    a first metal-oxide semiconductor field-effect transistor (MOSFET) formed on the SOI substrate having a drain port, a gate port, a source port, and a bulk port;
    a second MOSFET formed on the SOI substrate having a drain port, a gate port, a source port, and a bulk port, wherein the drain port of the second MOSFET is connected to the source port of the first MOSFET;
    a first resistive element formed on the SOI substrate having a first port and a second port, wherein the first port of the first resistive element is connected to the drain of the first MOSFET;
    a second resistive element formed on the SOI substrate having a first port and a second port, wherein the first port of the second resistive element is connected to the drain of the first MOSFET;
    a first word line connected to the gate port of the first MOSFET;
    a second word line connected to the gate port of the second MOSFET;
    a bit line connected to the second port of the first resistive element;
    an inverted bit line of the bit line connected to the second port of the second resistive element; and
    a select line connected to the source of the second MOSFET;
    wherein upon applying a predefined potential at the bit line, the inverted bit line, the word line, the second word line, the select line, the bulk port of the first MOSFET, and the bulk port of the second MOSFET, a state of the ReRAM cell is determined.

2. The ReRAM cell of claim 1, wherein each of the first MOSFET and the second MOSFET is selected from any of: an N-type and a P-type.

3. The ReRAM cell of claim 1, wherein the bulk port of the first MOSFET and the bulk port of the second MOSFET are the same bulk port.

4. The ReRAM cell of claim 1, wherein the bulk port of the first MOSFET and the bulk port of the second MOSFET are at the same potential.

5. The ReRAM cell of claim 1, wherein the first MOSFET comprises a plurality of MOSFETs connected in series.

6. The ReRAM cell of claim 1, wherein the second MOSFET comprises a plurality of MOSFETs connected in series.

7. The ReRAM cell of claim 1, wherein the first port of each of the first resistive element and the second resistive element is a bottom end port (BEP).

8. A resistive random-access memory (ReRAM) cell comprising:
- a silicon over insulator (SOI) substrate;
- a first metal-oxide semiconductor field-effect transistor (MOSFET) formed on the SOI substrate having a drain port, a gate port, a source port, and a bulk port;
- a second MOSFET formed on the SOI substrate having a drain port, a gate port, a source port, and a bulk port, wherein the drain port of the second MOSFET is connected to the source port of the first MOSFET;
- a first resistive element formed on the SOI substrate having a first port and a second port, wherein the first port of the first resistive element is connected to the source of the second MOSFET;
- a second resistive element formed on the SOI substrate having a first port and a second port, wherein the first port of the second resistive element is connected to the source of the second MOSFET;
- a first word line connected to the gate port of the first MOSFET;
- a second word line connected to the gate port of the second MOSFET;
- a bit line connected to the drain port of the first MOSFET;
- a select line connected to the second port of the first resistive element; and
- an inverted select line connected to the second port of the second resistive element;
- wherein upon applying a predefined potential at the bit line, the word line, the inverted word line, the select line, the inverted select line, the bulk port of the first MOSFET, and the bulk port of the second MOSFET, a state of the ReRAM cell is determined.

9. The ReRAM cell of claim 8, wherein the each of the first MOSFET and the second MOSFET is selected from any of: an N-type and a P-type.

10. The ReRAM cell of claim 8, wherein the bulk port of the first MOSFET and the bulk port of the second MOSFET are the same bulk port.

11. The ReRAM cell of claim 8, wherein the bulk port of the first MOSFET and the bulk port of the second MOSFET are at the same potential.

12. The ReRAM cell of claim 8, wherein the first MOSFET comprises a plurality of MOSFETs connected in series.

13. The ReRAM cell of claim 8, wherein the second MOSFET comprises a plurality of MOSFETs connected in series.

14. The ReRAM cell of claim 8, wherein the first port of each of the first resistive element and the second resistive element is a top end port (TEP).

* * * * *